(12) United States Patent
Lafarre et al.

(10) Patent No.: US 8,947,640 B2
(45) Date of Patent: Feb. 3, 2015

(54) POSITIONING DEVICE, LITHOGRAPHIC APPARATUS, POSITIONING METHOD AND DEVICE MANUFACTURING METHOD

(75) Inventors: Raymond Wilhelmus Louis Lafarre, Helmond (NL); Henrikus Herman Marie Cox, Eindhoven (NL); Antonius Franciscus Johannes De Groot, Someren (NL); Johannes Petrus Martinus Bernardus Vermeulen, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 248 days.

(21) Appl. No.: 13/494,703

(22) Filed: Jun. 12, 2012

(65) Prior Publication Data

US 2012/0327387 A1   Dec. 27, 2012

Related U.S. Application Data

(60) Provisional application No. 61/499,990, filed on Jun. 22, 2011.

(51) Int. Cl.
*G03F 7/20*        (2006.01)
*H01L 21/68*      (2006.01)

(52) U.S. Cl.
CPC .......... *G03F 7/70758* (2013.01); *H01L 21/682* (2013.01); *G03F 7/70716* (2013.01)
USPC .......... 355/72; 310/12.06; 310/12.15; 355/75

(58) Field of Classification Search
CPC ....... G03B 27/58; G03F 7/20; G03F 7/70758; G03F 7/70775; G03F 9/70; H01L 21/682
USPC .......... 310/12.05, 12.06, 12.13, 12.15, 12.19; 318/649; 355/72, 75
See application file for complete search history.

(56) References Cited

U.S. PATENT DOCUMENTS

| 7,348,752 | B1 | 3/2008 | Butler |
| 8,189,174 | B2 | 5/2012 | Kruizinga et al. |
| 2008/0067967 | A1 | 3/2008 | Butler |
| 2010/0128241 | A1 | 5/2010 | Kruizinga et al. |
| 2010/0157263 | A1 | 6/2010 | Van Eijk et al. |
| 2010/0157276 | A1* | 6/2010 | Shibazaki ........................ 355/72 |

FOREIGN PATENT DOCUMENTS

| JP | 2008-141165 | 6/2008 |
| JP | 2010-123960 | 6/2010 |
| JP | 2010-160037 | 7/2010 |
| JP | 2011-115021 | 6/2011 |
| JP | 2012-234109 | 11/2012 |

* cited by examiner

*Primary Examiner* — Colin Kreutzer
(74) *Attorney, Agent, or Firm* — Pillsbury Winthrop Shaw Pittman LLP

(57) ABSTRACT

A positioning device for positioning an object within a lithographic apparatus, including a support structure for supporting the object, at least two short-stroke units, each connected to the support structure, and a long-stroke unit. In the arrangement, each of the short-stroke units includes a short-stroke actuator system configured to provide independently at least one actuation force between the short-stroke unit and the long-stroke unit, and the long-stroke unit includes a long-stroke actuator system configured to provide at least one actuation force between the long-stroke unit and a reference structure of the lithographic apparatus.

20 Claims, 6 Drawing Sheets

POSITIONING DEVICE, LITHOGRAPHIC APPARATUS, POSITIONING METHOD AND DEVICE MANUFACTURING METHOD

CROSS REFERENCE TO RELATED APPLICATIONS

This application claims priority and benefit under 35 U.S.C. §119(e) to U.S. Provisional Patent Application Ser. No. 61/499,990, entitled "Positioning Device, Lithographic Apparatus, Positioning Method and Device Manufacturing Method," filed on Jun. 22, 2011, the content of which is incorporated herein in its entirety by reference.

FIELD

The present invention relates to a positioning device for positioning an object within a lithographic apparatus, a lithographic apparatus, a positioning method for positioning an object in a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

It is desirable to provide a positioning device within a lithographic apparatus that is configured to move an object within the lithographic apparatus and accurately control the position of the object.

According to an aspect of the invention, there is provided a positioning device for positioning an object within a lithographic apparatus, comprising:

a support structure for supporting the object;

at least two short-stroke units, each having a connection section connected to the support structure at a respective connection point; and a long-stroke unit;

wherein each of the short-stroke units comprises a short-stroke actuator system, configured to provide independently at least one actuation force between the connection section of the short-stroke unit and the long-stroke unit; and the long-stroke unit comprises a long-stroke actuator system, configured to provide at least one actuation force between the long-stroke unit and a reference structure of the lithographic apparatus.

According to an aspect of the invention, there is provided a lithographic apparatus comprising such a positioning device.

According to an aspect of the invention, there is provided a positioning method for positioning an object in a lithographic apparatus, comprising:

providing a support structure for supporting the object;

providing at least two short-stroke units, each having a connection section connected to the support structure at a respective connection point;

providing a long-stroke unit;

using a long-stroke actuator system to provide at least one actuation force between the long-stroke unit and a reference structure of the lithographic apparatus; and using respective short-stroke actuator systems to provide independently at least one actuation force between the connection section of each of the short-stroke units and the long-stroke unit. According to an aspect of the invention, there is provided a device manufacturing method, comprising using a lithography apparatus to transfer a pattern from the patterning device to a substrate and using the above method to position at least one of the patterning device and the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
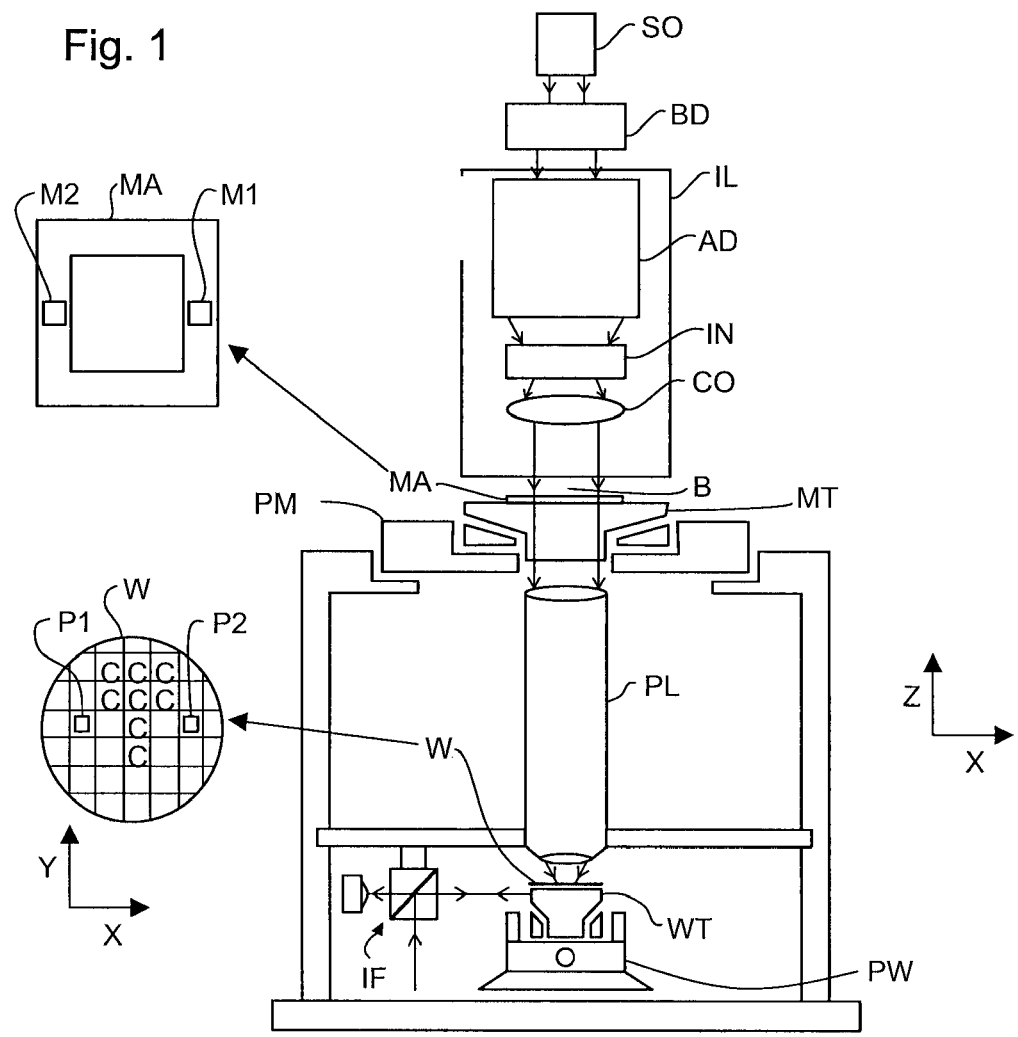
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure or patterning device support (e.g. a mask table) MT constructed to support a patterning device (e.g. a mask) MA and connected to a first positioner PM configured to accurately position the patterning device in accordance with certain parameters;

a second support structure, in particular a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT and/or substrate table WT may be realized with the aid of long-stroke actuator systems (coarse positioning) and short-stroke actuator systems (fine positioning), which form part of the first and second positioners PM, PW. This is discussed in further detail below. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
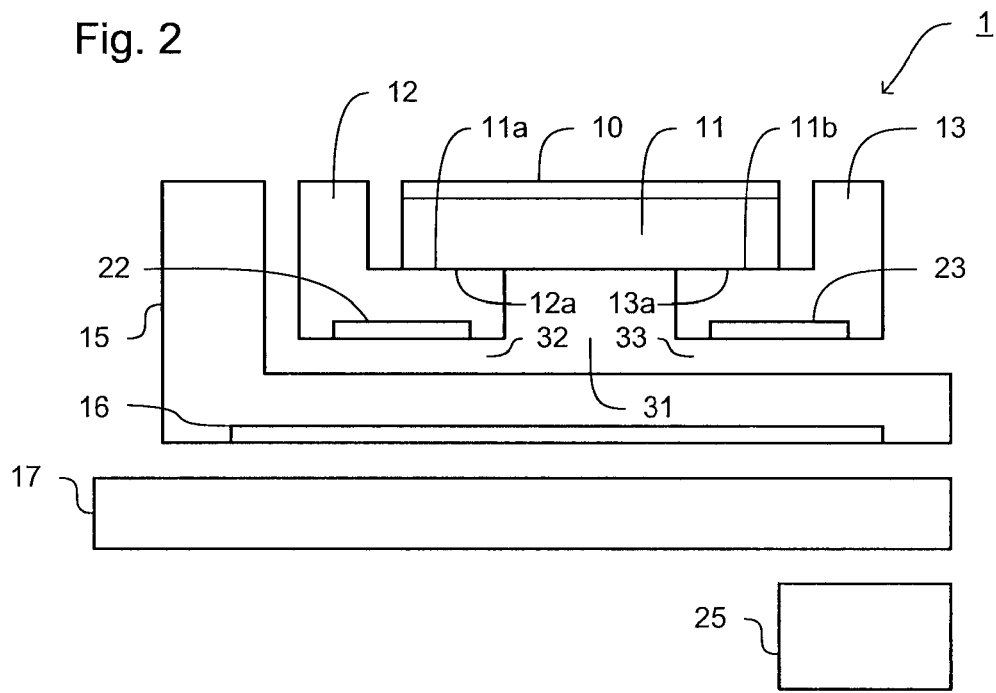
FIG. 2 depicts an arrangement of a positioning device according to an embodiment of the invention.

FIG. 2 schematically depicts an embodiment of a positioning device 1 according to an embodiment of the present invention. The positioning device may be used to control the position of an object 10 within a lithographic apparatus. Accordingly, the positioning device may be used as one or both of the positioners PM, PW discussed above for controlling the position of a patterning device MA or substrate W. It should be appreciated that such a positioning device 1 may also be used to control the position of one or more other objects within a lithographic apparatus.

As shown, the positioning device 1 includes a support structure 11 to support the object 10. Accordingly, if the object 10 is the patterning device MA, the support structure 11 may be, or may support, the support structure MT for supporting the patterning device MA discussed above. If the object 10 is the substrate W, the support structure 11 may be, or may support the substrate table WT discussed above.

Two or more separate short-stroke units 12,13 are provided and arranged to control the fine positioning of the support structure 11. As shown in FIG. 2, the short-stroke units 12,13 may support the support structure 11 as well as being connected to it in order to control its position. It should be appreciated, however, that the support structure 11 may also include a separate arrangement for bearing at least a part of its weight, such as a gas bearing or a magnetic/electromechanical gravity compensator.

The short stroke units 12,13 each include a connection section 12a,13a that connects to a respective connections point 11a,11b on the support structure.

The positioning device 1 further includes a long-stroke unit 15 that provides coarse positioning of the object 10. In particular, the long-stroke unit 15 may comprise an actuator system 16 that is configured to control the position of a frame or table in the long-stroke unit relative to a reference structure, for example a base frame, of the lithographic apparatus. In particular, the long-stroke actuator system 16 may provide at least one actuation force between the frame or table in the long-stroke unit 15 and the reference structure. This may be controlled based on a measurement of the position of the frame or table of the long-stroke unit 15 relative to at least one of the long-stroke units 12,13.

Each of the short-stroke units 12,13 may include a short-stroke actuator system 22,23. Each of the short-stroke actuator systems 22,23 may be configured to control the position of the respective short-stroke unit 12,13 relative to the long-stroke unit 15, for example relative to the long-stroke frame. In particular, each of the short-stroke actuator systems 22,23 may be configured to provide at least one actuation force between the respective short-stroke unit 12,13 and the long-stroke unit 15. This may be controlled based on a measurement of the position of at least one of the object 10, the support structure 11 and the short-stroke units 12,13, or a part thereof, relative to a reference structure, for example a metrology frame, of the lithographic apparatus. The metrology frame may be used as a reference for measuring the position of other items in the lithographic apparatus.

It will be appreciated that the long-stroke actuator system 16 may provide a relatively large range of movement compared to the short-stroke actuator systems 22,23 while the short-stroke actuator systems 22,23 may have better accuracy of positioning than the long-stroke actuator system 16. Accordingly, the combined positioning device 1 may have the range of movement of the long-stroke actuator system 16 but the accuracy of positioning of the short-stroke actuator system 22,23.

As shown in FIG. 2, a controller 25 may be provided to control the short-stroke actuator system 22,23 and the long-stroke actuator system 16, namely all of the actuator systems of the positioning device 1. It will be appreciated, however, that alternatively a separate controller may be provided for the short-stroke actuator system and the long-stroke actuator systems.

In the positioning device 1 of an embodiment of the present invention, the short-stroke actuator systems 22,23 may be independently controlled in order to control independently the position of the short-stroke units 12,13. This may provide significant benefits in the control of the movement of the support structure 11 and therefore the accuracy of positioning of object 10.

In particular, although a support structure 10, such as that for supporting a patterning device MA or for supporting a substrate W may desirably be designed to be very stiff, it will be appreciated that there are constraints on the attainable stiffness. In particular, if the size of the support structure 11 is to be increased, for example in a lithographic apparatus to process a substrate having a diameter of 450 mm rather than a diameter of 300 mm, the inherent stiffness may be reduced unless, for example, the thickness of the support structure 11 is increased. However, this may not be possible because it would result in increased mass. This in turn would either reduce the acceleration from actuation forces of a given level or result in a requirement to increase the actuation force available, neither of which may be desirable. However, reducing the stiffness of the support structure 11 in turn reduces the mechanical resonant frequencies of the support structure 11, which may reduce the controller bandwidth.

The positioning device 1 of an embodiment of the present invention may reduce the above problem because each of the short-stroke units 12,13 may be independently controlled in order to provide fine positioning of the support structure 11. Accordingly, the short-stroke unit 12,13 may be controlled by the controller 25 without treating the support structure 11 as a rigid body as is the case in a conventional arrangement of a long-stroke actuator system with a single short-stroke actuator system, in which the control system must treat the support structure 11 (or equivalent thereof) as a rigid body.

Accordingly, by using the positioning device 1 of an embodiment of the present invention, a higher controller bandwidth may be provided.

Furthermore, because the positioning device 1 may be configured such that a plurality of short-stroke actuator systems 22,23 can drive the support structure 11 in a given degree of freedom, non-rigid body control is enabled. This may enable the positioning device 1 to control one or more non-rigid mode shapes corresponding to resonant frequencies of the support structure 11 using the independently controlled short-stroke units.

A further benefit of the positioning device 1 compared to a previously known combination of a long-stroke actuator system with a single short-stroke actuator system is the reduction of the so-called air-squeeze effect. This may be caused by the presence of a small separation between a short-stroke unit and a long-stroke unit, which move relative to each other. In the case of a previously known system, in which the short-stroke unit may extend across the full width of the support structure 11, there may be a large area in which a thin film of air is trapped between the relatively moving short-stroke unit and the long-stroke unit. This may result in disturbance forces on the short-stroke unit leading to positioning errors. In contrast, as shown in FIG. 2, there may be relatively small areas 32,33 in which a thin film of air separates the short-stroke units 12,13 from the long-stroke unit 15 and a region 31 in between, in which a relatively large air gap is provided between the support structure 11 and the long-stroke unit 15.

Depending on the way in which the short-stroke units 12, 13 are to be driven, an appropriate manner of connecting the short-stroke units 12,13 to the support structure 11 may be selected. In an embodiment, each of the short-stroke units 12,13 may be connected to the respective connection point 11a,11b of the support structure 11 by means of a simple spring rod, or arrangement of spring rods, in order to provide stiffness in one, two or three translational directions, namely to substantially prevent movement of the short-stroke units 12,13 relative to the support structure 11 in those directions.

It will be appreciated that these directions may be one or more of two orthogonal directions within a plane parallel to the upper surface of the support structure 11 and a direction substantially perpendicular to the upper surface of the support structure 11. Such an arrangement may be configured such that there is relatively low stiffness for rotational movement of the support structure 11 relative to the short-stroke units 12,13 about one or more axes, such as axes parallel to the one or more translational directions discussed above.

In an embodiment, the support structure 11 may be connected to the short-stroke units 12,13 such that the connections additionally provide stiffness rotationally about one or more axes, such as the axes of rotation discussed above. As discussed above, this may enable additional control of the support structure 11. In an alternative embodiment the support structure 11 and the object may be the same body.

Figure 3:
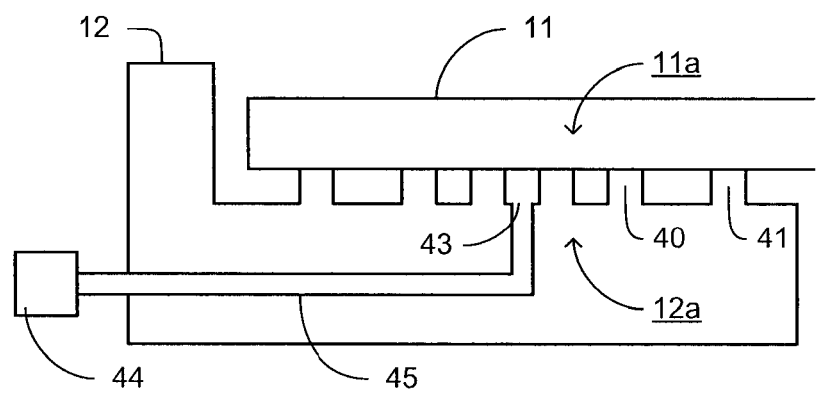
FIG. 3 depicts in more detail part of the positioning device depicted in FIG. 2.

FIG. 3 depicts an arrangement by which the support structure 11 may be connected to a short-stroke unit 12. As shown, the connection section 12a of the short-stroke unit 12 may include a plurality of burls 40 forming a receiving surface that supports a surface of the support structure 11 at the connection point 11a of the support structure 11. A barrier 41 may surround the plurality of burls 40, defining a space 42 that may be evacuated by one or more openings 43 connected to a vacuum source 44 by a gas conduit 45 in order to form a vacuum clamp. Such a connection may provide high stiffness in both translational and rotational directions.

Furthermore, such an arrangement permits the detachment of the support structure 11 from the short-stroke unit 12, enabling replacement of the support structure 11 if desired. The thermal conduction between the short-stroke unit 12 and the support structure 11 may be minimised due to the minimal physical contact between the short-stroke unit 12 and the support structure 11, which is limited to the burls 40 and the barrier 41.

It should be appreciated, however, that an alternative mechanism may be used to connect the support structure 11 to the plurality of short-stroke units 12,13, including alternative arrangements that allow the support structure 11 to be detached from the short-stroke unit 12,13 as desired.

It should further be appreciated that the short-stroke actuator units 22,23 may be formed in any convenient manner. In particular, the short-stroke actuator units 22,23 may include, for example, planar motors that may be configured to provide actuation forces to control the position of the short-stroke units 12,13 in directions within a plane parallel to the upper surface of the support structure 11 and, if desired, rotationally about an axis perpendicular to the upper surface of the support structure 11.

The short-stroke actuator systems 22,23 may additionally, if required, include one or more actuators providing actuation forces to the short-stroke units 12,13 in a direction substantially perpendicular to the upper surface of the support structure 11. It should be appreciated that the actuators providing forces in a direction substantially perpendicular to the upper surface of the support structure 11 may be included within planar motors such as those discussed above. Accordingly, positional control of the short-stroke units 12, 13 in the direction substantially perpendicular to the upper surface of the support structure 11 may be provided and, if desired, rotational position control of the short-stroke units 12,13, about one or more axes within a plane substantially parallel to the upper surface of the support structure 11.

Accordingly, six degree of freedom positional control of each of the short-stroke units 12,13 may be provided. As discussed above, the control of each of the short-stroke units may be independent from the control of the others.

Figure 4:
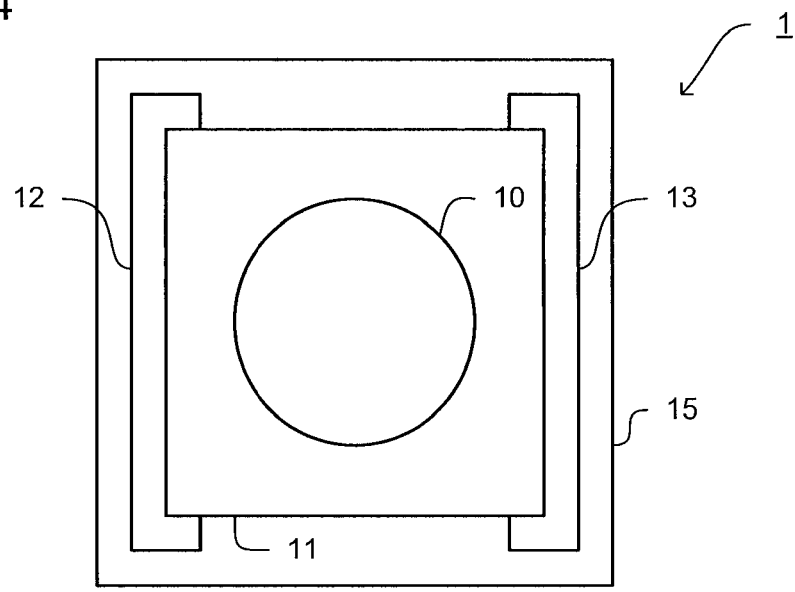
FIGS. 4, 5 and 6 depict in plan view optional arrangements of a positioning device according to embodiments of the invention.

FIG. 4 schematically depicts a plan view of the positioning device 1 according to an embodiment of the present invention. As shown, two short-stroke units 12,13 may be provided that are used to control the position of the support structure 11 relative to a long-stroke unit 15. However, it should be appreciated that any number of additional short-stroke units may be provided.

Figure 5:
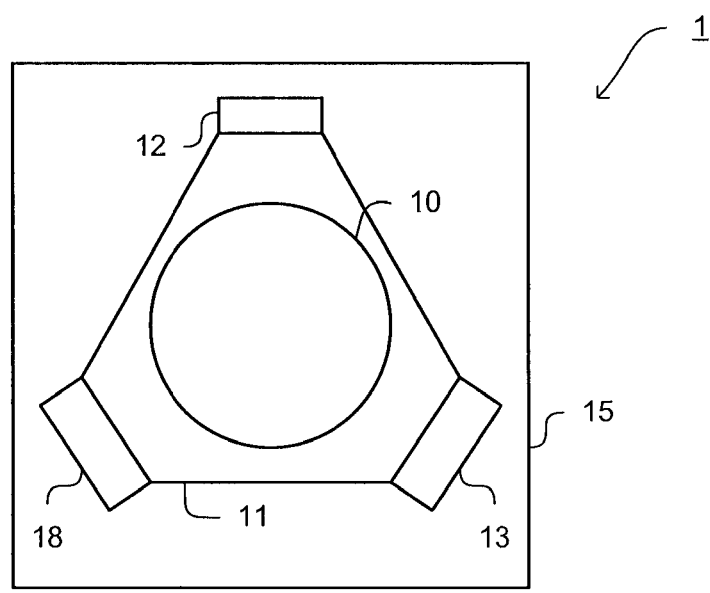
Figure 6:
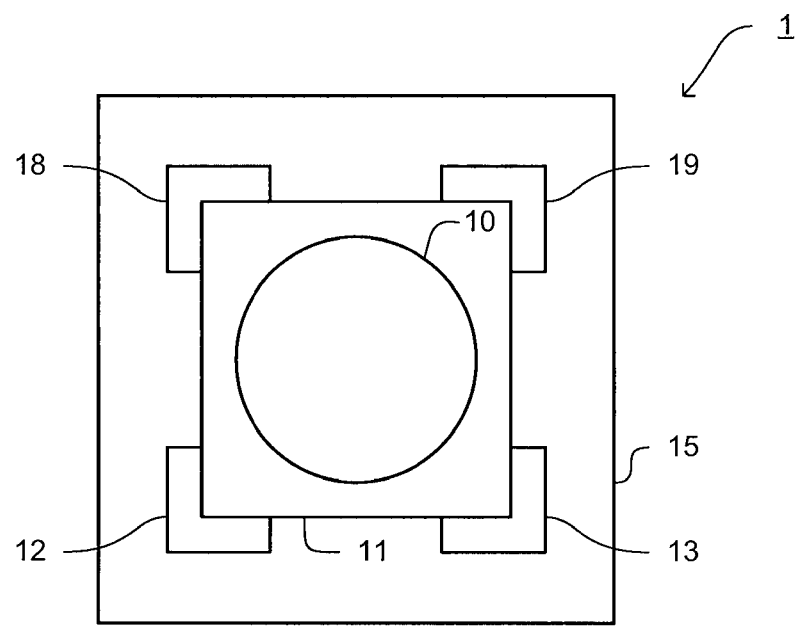

For example, FIG. 5 schematically depicts a plan view of a positioning device 1 according to an embodiment of the present invention, in which three short-stroke units 12,13,18 are provided to control the position of the support structure 11 relative to the long-stroke unit 15. Similarly, FIG. 6 depicts schematically a plan view of a positioning device 1 according to an embodiment of the present invention in which four short-stroke units 12,13,18,19 are provided to control the position of the support structure 11 relative to the long-stroke unit 15.

In general, it should be appreciated that greater control of the support structure 11, may be provided by use of increasing numbers of short stroke units. In particular, the non-rigid-body behaviour of the support structure 11 may be controlled to a greater extent by using greater numbers of short-stroke units. However, the complexity of the control of the short-stroke units also increases with the number of short-stroke units used.

In order for the controller 25 to control the short-stroke units 12,13,18,19 appropriately, in order to control in turn the position of the support structure 11, and therefore the object 10, it will be appreciated that the controller 25 may be connected to one or more position measurement systems in order to provide information concerning the position of one or more elements of the positioning device 1.

It should be appreciated that in the context of embodiments of the present invention, any suitable position measurement system may be used. In particular, the position measurement system may be based on an interferometric device or a linear encoder. Accordingly, a position sensor 51 may be provided on a component of the positioning device, as discussed further below, and configured to measure the position of the position sensor 51 relative to a target 52 on a reference structure 53, such as a reference frame, within the lithographic apparatus.

However, this may be reversed, namely the position sensor 51 may be mounted to the reference structure 53 and the target may be provided on the component of the positioning device 1. Other position sensor systems may also be used.

Figure 7:
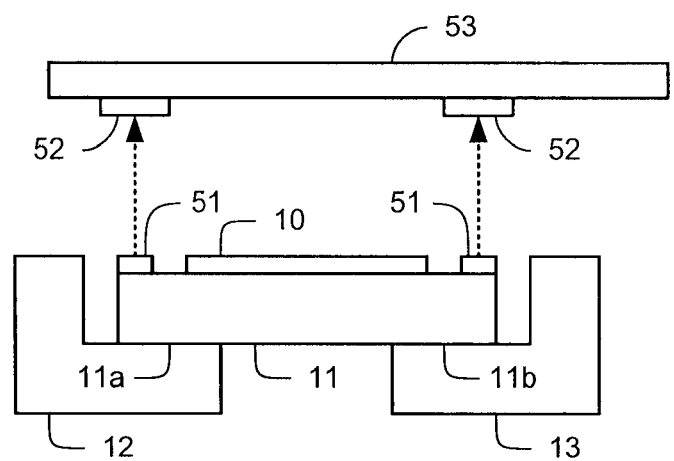
FIGS. 7, 8 and 9 depict arrangements of position sensing systems that may be used as part of a positioning device according to an embodiment of the present invention.

In an arrangement of an embodiment of the invention, as depicted in FIG. 7, one or more position sensors 51 may be provided to the support structure 11 and used in order to determine the position of the support structure 11 relative to the reference structure 53 of the lithographic apparatus. This information may be used directly in the control of the actuator systems. An arrangement of a support structure 53 having position sensors 51 for determining the position of the support structure 53 is disclosed in U.S. provisional application No. 61/474,119, which is hereby incorporated by reference.

Alternatively or additionally, using this information, the controller 25 may determine the position of the short-stroke units 12,13. However, as discussed above, the support structure 11 may be considered not to behave as a rigid body. Accordingly, in such an arrangement, the one or more position sensors 51 provided on the support structure 11 may be arranged as close as possible to the connection points 11a,11b at which the short-stroke units 12,13 are connected in order to minimise any error introduced by the non-rigid body behaviour of the support structure 11.

Figure 8:
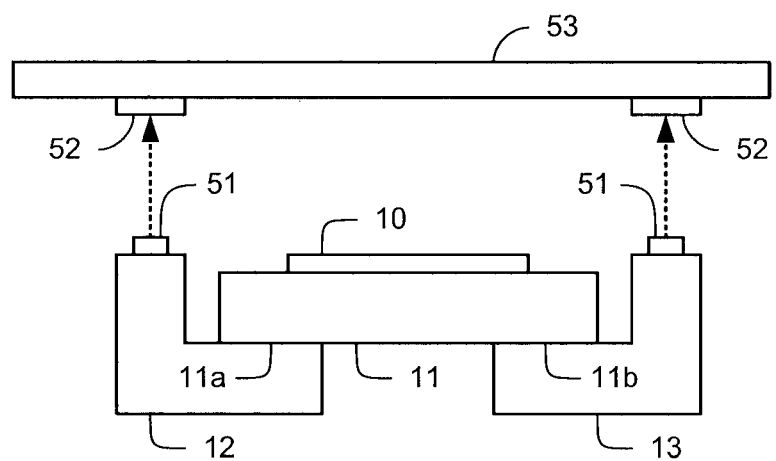

Alternatively or additionally, as depicted in FIG. 8, one or more position sensors 51 may be provided to each of the short-stroke units 12,13 in order to directly measure the position of the short-stroke units 12,13 relative to the reference structure 53 of the lithographic apparatus. It will be appreciated that, in an arrangement in which position sensors 51 are not provided to the support structure 11 in order to directly determined the position of the support structure 11 relative to the reference structure 53 of the lithographic apparatus, the controller 25 may determine the position of the support structure 11, and therefore the object 10 from the measured positions of the short-stroke units 12,13.

Figure 9:
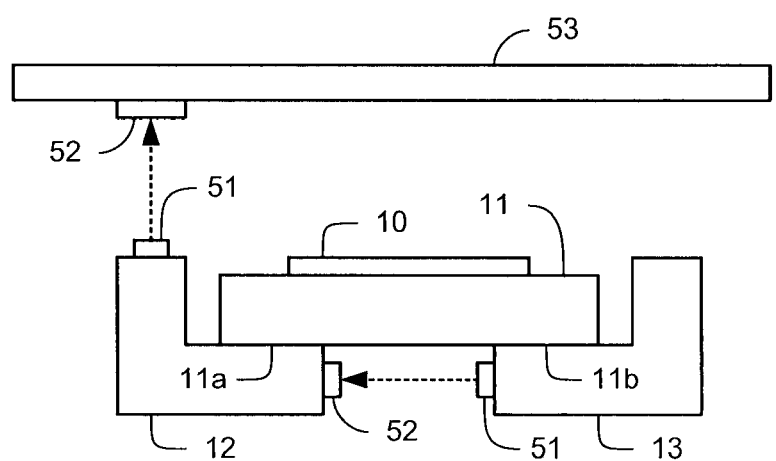

Alternatively or additionally, as depicted in FIG. 9, a position sensor 51 may be provided to a first-stroke unit in order to directly measure the position of the first short-stroke unit 12 relative to the reference structure 53 of the lithographic apparatus. Each of the short-stroke units 13 other than the first short-stroke unit 12, may be provided with a position sensor 51 configured to determine the position of the associated short-stroke unit 13 relative to a target 52 provided on the first short-stroke unit 12.

It will be appreciated that any combination of the arrangements discussed above may be used in order to provide requisite position data to the controller 25 in order to control the actuator systems of the plurality of short-stroke units 12,13.

Figure 10:
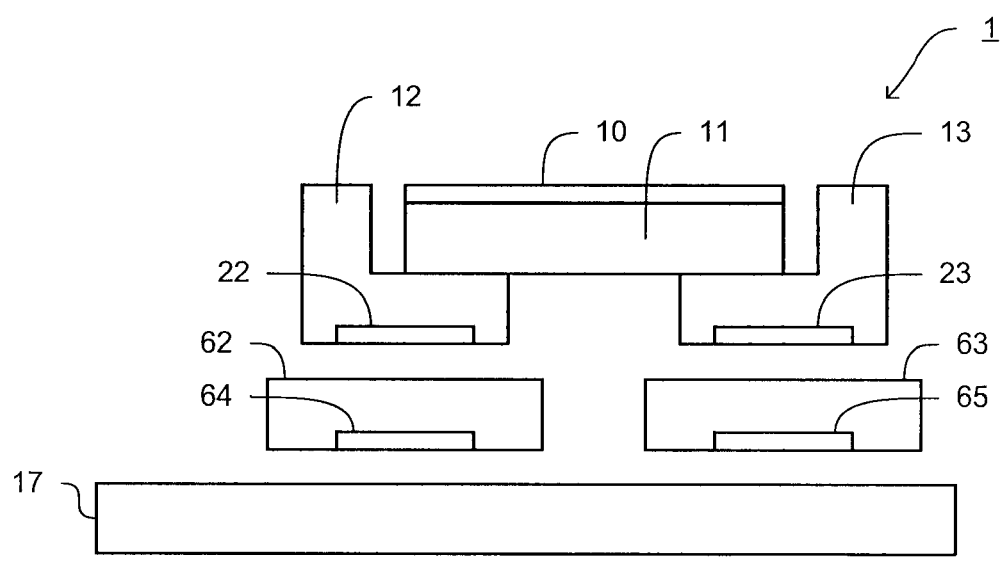
FIG. 10 depicts a variant of a positioning device according to an embodiment of the present invention.

FIG. 10 depicts a further variation of the positioning system 1 of an embodiment of the present invention that may be used in combination with any of the above-described arrangements of the present invention. Description of the common parts will not be repeated.

As shown in FIG. 10, this arrangement differs from those previously described in that the long-stroke unit is divided into separate long-stroke modules associated with each short-stroke unit 12,13. In particular, the long-stroke unit includes a sub-frame 62,63 associated with each short-stroke unit 12,13. In this arrangement, the short-stroke actuator systems 22,23 are arranged to control the position of the short-stroke units 12,13 relative to the respective sub-frame 62,63 of the long-stroke unit 15. The long-stroke unit 15 further includes respective sub-frame actuator systems 64,65 that are configured to control the position of the respective sub-frames 62,63 relative to the reference frame 17 of the lithographic apparatus.

As with the long-stroke actuator system 16 of the arrangement depicted in FIG. 2, each of the sub-frame actuator systems 64,65 may be configured to have a relatively large range of movement compared to the short-stroke actuator systems 22,23 but need not have the same accuracy of positioning as the short-stroke actuator systems 22,23. Effectively, therefore, a separate long-stroke system may be provided for each of the short-stroke units 12,13 and may be independently controlled.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A positioning device for positioning an object within a lithographic apparatus, the positioning device comprising:
   a support structure configured to support the object;
   at least two short-stroke units, each having a connection section connected to the support structure at a respective connection point; and
   a long-stroke unit;
   wherein each of the short-stroke units comprises a short-stroke actuator system configured to cooperate with a same surface of the long-stroke unit to provide independently an actuation force between the connection section of the short-stroke unit and the long-stroke unit so that a position of a first of the at least two short-stroke units is independently controlled relative to a position of a second of the at least two short-stroke units; and
   wherein the long-stroke unit comprises a long-stroke actuator system configured to provide an actuation force between the long-stroke unit and a reference structure of the lithographic apparatus.

2. A positioning device according to claim 1, wherein the connection section of each of the short-stroke units is connected to the respective connection point of the support structure such that the connection section prevents translational movement of the connection point relative to the connection section of each of the short-stroke units in one of one, two and three orthogonal directions.

3. A positioning device according to claim 2, wherein the short-stroke actuator system of each short-stroke unit is configured to provide an actuation force between the connection section of the short-stroke unit and the long-stroke unit in said one of one, two and three orthogonal directions.

4. A positioning device according to claim 2, wherein the connection section of each of the short-stroke units is connected to the respective connection point of the support structure such that the connection section prevents rotational movement of the connection point relative to the connection section of the short-stroke module about one of one, two and three orthogonal axes.

5. A positioning device according to claim 1, wherein the short-stroke units are detachably connected to the support structure.

6. A positioning device according to claim 1, wherein the connection section of each of the short-stroke units comprises a receiving surface having a plurality of burls, configured to support a surface of the support structure.

7. A positioning device according to claim 6, wherein the support structure is secured to the receiving surface of each of the short-stroke units by a vacuum clamp.

8. A positioning device according to claim 1, wherein the long-stroke unit comprises a long-stroke frame;
   wherein the long-stroke actuator system provides an actuation force between said long-stroke frame and the reference structure; and
   wherein the short-stroke actuator system of each short-stroke unit provides its actuation force between the short-stroke unit and the long-stroke frame.

9. A positioning device according to claim 1, wherein the long-stroke unit comprises a sub-frame corresponding to each of the short-stroke units;
   wherein the long-stroke actuator system comprises a sub-frame actuator system corresponding to each sub-frame, configured to provide an actuation force between the respective sub-frame and the reference structure; and
   wherein each short-stroke actuator system provides its actuation force between the respective short-stroke unit and a respective sub-frame.

10. A positioning device according to claim 1, further comprising a controller configured to control independently said short-stroke actuator systems to control the position of the support structure.

11. A positioning device according to claim 10, wherein said controller is configured to control said short-stroke actuation system based on measurements of the position of at least one of the object, the support structure and the connection section of the short-stroke unit relative to the reference structure of the lithographic apparatus.

12. A positioning device according to claim 1, further comprising a position measurement system configured to measure the position of the support structure relative to the reference structure within the lithographic apparatus.

13. A positioning device according to claim 1, wherein each of the short-stroke units comprises a position measurement system configured to measure the position of the short-stroke unit relative to a reference structure within the lithographic apparatus.

14. A positioning device according to claim 1, wherein a first of the short-stroke units comprises a position measurement system configured to measure the position of said first short-stroke unit relative to a reference structure within the lithographic apparatus; and
   wherein the short-stroke units other than said first short-stroke unit each comprise a position measurement system, configured to measure the position of the short-stroke unit relative to said first short-stroke unit.

15. A positioning device according to claim 1, comprising one of two, three and four short-stroke units.

16. A positioning device according to claim 1, wherein the object is one of a substrate and a patterning device.

17. A positioning device according to claim 1, wherein the support structure and the object are the same.

18. A lithographic apparatus comprising the positioning device of claim 1.

19. A positioning method for positioning an object in a lithographic apparatus, the method comprising:

providing a support structure for supporting the object;
providing at least two short-stroke units, each having a connection section connected to the support structure at a respective connection point;
providing a long-stroke unit;
providing an actuation force between the long-stroke unit and a reference structure of the lithographic apparatus using a long-stroke actuator system; and
providing independently an actuation force between the connection section of each of the short-stroke units and the long-stroke unit using respective short-stroke actuator systems that cooperate with a same surface of the long-stroke unit so that a position of a first of the at least two short-stroke units is independently controlled relative to a position of a second of the at least two short-stroke units.

20. A device manufacturing method, comprising:
transferring a pattern from a patterning device to a substrate with a lithography apparatus;
positioning at least one of the patterning device and the substrate with the method of claim 19.

* * * * *